(12) United States Patent
Chava et al.

(10) Patent No.: US 11,973,160 B2
(45) Date of Patent: Apr. 30, 2024

(54) VOLTAGE TUNABLE SOLAR BLINDNESS IN TFS GROWN EG/SIC SCHOTTKY CONTACT BIPOLAR PHOTOTRANSISTORS

(71) Applicant: University of South Carolina, Columbia, SC (US)

(72) Inventors: Venkata Surya N. Chava, Columbia, SC (US); MVS Chandrashekhar, Columbia, SC (US); Anusha Balachandran, Columbia, SC (US)

(73) Assignee: University of South Carolina, Columbia, SC (US)

( * ) Notice: Subject to any disclaimer, the term of this patent is extended or adjusted under 35 U.S.C. 154(b) by 0 days.

(21) Appl. No.: 17/700,983

(22) Filed: Mar. 22, 2022

(65) Prior Publication Data

US 2022/0216359 A1   Jul. 7, 2022

Related U.S. Application Data

(63) Continuation of application No. 16/624,402, filed as application No. PCT/US2018/039673 on Jun. 27, 2018, now Pat. No. 11,309,449.

(60) Provisional application No. 62/525,259, filed on Jun. 27, 2017.

(51) Int. Cl.
*H01L 31/11*     (2006.01)
*H01L 31/109*    (2006.01)
*H01L 31/18*     (2006.01)

(52) U.S. Cl.
CPC ........ *H01L 31/1105* (2013.01); *H01L 31/109* (2013.01); *H01L 31/1816* (2013.01)

(58) Field of Classification Search
CPC . H01L 31/1105; H01L 31/109; H01L 31/1816
USPC .......................................................... 257/462
See application file for complete search history.

(56) References Cited

U.S. PATENT DOCUMENTS

| | | | |
|---|---|---|---|
| 5,311,047 A | 5/1994 | Chang | |
| 2003/0157745 A1* | 8/2003 | Zeghbroeck | H01L 29/73 257/E29.174 |
| 2007/0210349 A1* | 9/2007 | Lu | C12Q 1/6837 257/252 |
| 2014/0284598 A1* | 9/2014 | Boutwell | H01L 31/18 438/85 |
| 2016/0315211 A1* | 10/2016 | Chandrashekhar | H01L 31/028 |
| 2018/0122970 A1* | 5/2018 | Park | H01L 31/03048 |

OTHER PUBLICATIONS

Chava, Venkata et. al., Epitaxial Graphene (EG)/SiC based Schottky Emitter Bipolar Phototransistors for UV Detection and Effect of Hydrogen Intercalation on Device I-V Characteristics, 2016 IEEE Sensors, IEEE, Oct. 30, 2016.

Rana, Tawhid, et al., Epitaxial Gowth of Graphene on SiC by Si Selective Etching Using SIF4 in an Inert Ambient, Japanese Journal of Applied Physics, vol. 54, No. 3, 030304, Feb. 3, 2015.

(Continued)

*Primary Examiner* — Calvin Y Choi
(74) *Attorney, Agent, or Firm* — Burr & Forman; Douglas L. Lineberry

(57) ABSTRACT

A voltage tunable solar-blind UV detector using a EG/SiC heterojunction based Schottky emitter bipolar phototransistor with EG grown on p-SiC epi-layer using a chemically accelerated selective etching process of Si using TFS precursor.

19 Claims, 10 Drawing Sheets

(56) References Cited

OTHER PUBLICATIONS

Chava, Venkata, et al., Evidence of Minority Carrier Injection Efficiency >90% in an Epitaxial Graphene/SiC Schottky Enitter Bipolar Junction Phototransistor for Ultraviolet Detection, Applied Physics Letters, AIP Publishing, LLC, US vol. 108, No. 4, 043502, Jan. 26, 2016.

Chava, Venkata, et al., High Detectivity Visbile-blind SiF4 Grown Epitaxial Graphene/SiC Schottky Contact Bipolar Phototransistor, Applied Physics Letters, vol. III, No. 24, 243504, Dec. 11, 2017.

* cited by examiner

TABLE 1. Comparison of the EG/SiC phototransistor performance metrics with previously reported ultraviolet detectors.

| Device type | Voltage (V) | Dark current | Responsivity at 270 nm (A/W) | Visible rejection (270-400 nm) | Response time | NEP (W) | Specific detectivity, $D^*$ (Jones) |
|---|---|---|---|---|---|---|---|
| EG/SiC BJT (SC mode) | 20 | 230 pA | 17 | $5.6 \times 10^3$ | 10 ms (On) 47 ms (Off) | $2.3 \times 10^{-15}$ | $4.4 \times 10^{13}$ (BW = 20 Hz) |
|  | 10 | 100 pA | 2.2 | $2.2 \times 10^2$ | NA | $1.1 \times 10^{-14}$ | $8.6 \times 10^{12}$ (BW = 20 Hz) |
|  | 5 | 55 pA | 1.1 | $4 \times 10^2$ | NA | $1.7 \times 10^{-14}$ | $5.8 \times 10^{12}$ (BW = 20 Hz) |
| EG/SiC BJT (SE mode) | 20 | 670 pA | 25 | 123 | 46 ms (On) 730 ms (Off) | $3.3 \times 10^{-12}$ | $9.5 \times 10^9$ (BW = 1 Hz) |
| SiC p-i-n diode[5] | 20 | <0.5 pA | 0.13 | $>10^4$ | NA | NA | NA |
| SiC Schottky[36] | 5 | 8 pA | ~0.09 | $>10^3$ | NA | NA | NA |
| SiC APD[37] | 144 | 5 pA | 93 (at 280 nm) | NA | NA | $4.4 \times 10^{-15}$ | $6.4 \times 10^{13}$ (BW = 1 kHz) |
| GaN Schottky[35] | 1.5 | 34 nA | ~0.07 | $>10^3$ | 180 ns | $3.7 \times 10^{-9}$ | NA |
| AlGaN Schottky[7] | 1.35 | 7 nA | ~0.07 | NA | 1.6 μs | $6.6 \times 10^{-14}$ | NA |
| AlGaN photodiode[38] | 0.5 | 0.1 pA | ~0.01 | $2.6 \times 10^3$ | <0.4 μs | NA | NA |

FIGURE 9

VOLTAGE TUNABLE SOLAR BLINDNESS IN TFS GROWN EG/SIC SCHOTTKY CONTACT BIPOLAR PHOTOTRANSISTORS

This invention was made with government support under grant ECCS1309466 awarded by the National Science Foundation. The government has certain rights in the invention.

BACKGROUND OF THE INVENTION

1) Field of the Invention

The present invention relates to a voltage tunable solar-blind UV detector using an EG/SiC Schottky junction bipolar phototransistor where EG is grown on a SiC (0001) epilayer, using Tetrafluorosilane (TFS) to chemically accelerate the removal of Si.

2) Description of Related Art

UV radiation, which is spread across 10-400 nm in the electromagnetic spectrum, is subdivided into four regions, UV-A (315-400 nm), UV-B (280-315 nm), UV-C (200-280 nm) and vacuum UV (10-200 nm). Portions of the UV spectrum, such as UV-A (315-400 nm), are relatively benign to human health. Conversely, UV-B (280-315 nm) and UV-C (200-280 nm) may cause cancer in humans.

The Sun is the natural source for UV radiation. Short wavelength vacuum UV and UV-C radiation from the sun is by the earth's atmosphere, only the UV-A and part of UV-B (>290 nm) radiation reaches the earth's surface. The solar UV radiation present in the earth's atmosphere could result in false alarms when UV detectors produce an output signal corresponding to outdoor solar UV radiation. There are numerous government and commercial applications that require high responsivity UV detectors with solar blindness i.e. only responsive to light with wavelength <290 nm. Chen, Hongyu, et al. "New concept ultraviolet photodetectors." *Materials Today* 18.9 (2015): 493-502. These include furnace gas control systems, as well as aerospace and harsh environment detection systems that require the sensing of the UV emission from plumes, or for flame detection for firefighters, in the presence of large amounts of visible and IR radiation (FIG. 1). In the parlance of healthcare, Chen, Hongyu, et al. "New concept ultraviolet photodetectors." *Materials Today* 18.9 (2015): 493-502., one must be able to distinguish UVA light (relatively harmless) from UVB and UVC light (cancer causing, used in water disinfection to kill bacteria). The key metric used to describe the performance of photo detectors is responsivity, $R(\lambda)$, i.e., the number of amperes of electrical photocurrent, $I_{ph}$, in response to each Watt of incident optical power, $P_{opt}$, at a given wavelength, $\lambda$ $$R(\lambda) = \frac{I_{ph}(\lambda)}{P_{opt}} = \frac{I(\lambda) - I(\text{dark})}{P_{opt}}$$

where $I(\lambda)$ is the current under fixed wavelength ($\lambda$) illumination and I(dark) is the current under no illumination.

Currently, the most commonly used photodetectors at UVC wavelengths are traditional narrow-gap semiconductors such as Si-photodiodes. These typically have R<0.3 A/W, and they also require expensive filters to achieve solar-blindness. On the other hand, for high-end applications, photomultiplier tubes (PMT) offer high responsivity, but also require high (>1000 V) voltages for operation, necessitating bulky, expensive power supplies.

Moreover, for solar blind UV detection, wide bandgap (WBG) semiconductors like SiC, GaN and AlGaN are preferred over traditional Si (narrow band gap, Eg=1.1 eV) semiconductor based UV detectors as they do not require additional filters for their operation. Particularly, SiC UV detectors are a good choice for applications operating in high temperature and high radiation conditions and are also durable under long-term UV exposure. In the past, a variety of SiC UV detectors, such as Schottky photodiode, PIN diode, avalanche photodiode and MSM (metal-semiconductor-metal) photodiode were developed. Further, wideband gap semiconductor bipolar UV phototransistor devices with high responsivities, for example high gain AlGaN/GaN HBTs (McCarthy, L. S., et al. "AlGaN/GaN heterojunction bipolar transistor." *IEEE Electron Device Letters* 20.6 (1999): 277-279; Shelton, B. S., et al. "AlGaN/GaN heterojunction bipolar transistors grown by metal organic chemical vapour deposition." *Electronics Letters* 36.1 (2000): 80-81.) due to inherent bipolar gain were reported.

Although $Al_xGa_{1-x}N$ (X>0.5) based ultra-wide bandgap (UWBG) UV detectors are inherently solar-blind, the $Al_xGa_{1-x}N$ UV detectors have disadvantages preventing their use for practical applications. One major disadvantage for AlGaN based solar-blind UV detectors is lack of native substrates and this results in poor quality AlGaN epitaxial layers when grown on foreign substrates such as SiC, AlN and Sapphire. (Nikzad, Shouleh, et al. "Single photon counting UV solar-blind detectors using silicon and iii-nitride materials." *Sensors* 16.6 (2016): 927.)

In addition to the photon absorbing semiconductor material, the choice of top contact electrodes, which may see the incident photons first before they enter active semiconductor material and is also used to collect the charge carriers generated in the device, is also a key factor that influences the responsivity (R) of the photodetectors. Metal electrodes used in conventional UV photodetectors, typically not fully transparent to UV and visible light radiation, may cause absorption/reflection losses, resulting in low photoresponsivity (R) under UV light. In the recent past, graphene was studied widely for its application as a contact electrode for flexible electronics applications. (Keun Soo, et al. "Large-scale pattern growth of graphene films for stretchable transparent electrodes." *Nature* 457.7230 (2009): 706-710.)

Graphene is a popular 2D material that has exceptional material properties such as high carrier mobility >$2 \times 10^5$ cm$^2$ V$^{-1}$ s$^{-1}$, high optical transmission >90%, very high thermal conductivity $5 \times 10^3$ Wcm$^{-1}$K$^{-1}$, high Young's modulus 1500 GPa (for mechanical strength), etc. It is also highly transparent to UV and visible radiation, absorbing only 0.6%/ML on SiC. (Bonaccorso, Francesco, et al. "Graphene photonics and optoelectronics." *Nature Photonics* 4.9 (2010): 611-622; Neto, A H Castro, et al. "The electronic properties of graphene." *Reviews of modern physics* 81.1 (2009): 109; Dawlaty, Jahan M., et al. "Measurement of the optical absorption spectra of epitaxial graphene from terahertz to visible." *Applied Physics Letters* 93.13 (2008): 131905). One monolayer (ML) graphene corresponds to 0.34 nm thick graphene layer. In addition to high optical transmission in UV-visible regime, graphene also shows very low 1/f noise and thermal noise which makes it suitable for photodetector applications. Due to these exceptional material properties, graphene has a wide variety of applications such as in photodetectors, high speed transistors, chemical and biological sensors, displays, batteries, hydrogen storage, solar cells etc.

In addition, graphene can be directly grown on SiC in large areas using thermal sublimation and chemical vapor deposition techniques suitable for high volume manufacturing. (Emtsev, Konstantin V., et al. "Towards wafer-size graphene layers by atmospheric pressure graphitization of silicon carbide." *Nature Materials* 8.3 (2009): 203-207.). These developments in graphene growth technology, in addition to graphene's exceptional material properties, led to the development of SiC UV detectors with transparent graphene layers with high electrical conductivity as top contact electrodes. Recently, SiC (Kus, E., Özkendir, D., Firat, V., & Çelebi, C. (2015). Epitaxial graphene contact electrode for silicon carbide based ultraviolet photodetector. *Journal of Physics D: Applied Physics*, 48(9), 095104), Ga2O3, (Qu, Yingyu, et al. "Enhanced Ga2O3/SiC ultraviolet photodetector with graphene top electrodes." *Journal of Alloys and Compounds* 680 (2016): 247-251) and GaN (Babichev, A. V., et al. "GaN nanowire ultraviolet photodetector with a graphene transparent contact." *Applied Physics Letters* 103.20 (2013): 201103.) UV photodetectors are demonstrated with enhanced UV photoresponsivity by using graphene as top contact electrodes. Also, T. J. Anderson et al. reported an EG/SiC heterojunction diode for UV detection with a peak responsivity of 0.2 A/W at 310 nm. (Anderson, Travis J., et al. "Ultraviolet detector based on graphene/SiC heterojunction." *Applied Physics Express* 8.4 (2015): 041301.)

In general, a Schottky diode is formed when graphene is grown on semiconductor materials such as Si, GaAs and 4H-SiC substrates (Tongay, S., T. Schumann, and A. F. Hebard, "Graphite based Schottky diodes formed on Si, GaAs, and 4H-SiC substrates." *Applied Physics Letters* 95.22 (2009): 222103). In the case of epitaxial graphene (EG) grown on SiC, a Schottky barrier is formed with EG fermi level pinned to the conduction band of SiC. (Anderson, Travis J., et al. "Ultraviolet detector based on graphene/SiC heterojunction." *Applied Physics Express* 8.4 (2015): 041301.) Further, a large Schottky barrier, in the case of graphene/p-SiC (2.7 eV), Schottky junction would result in reduced reverse leakage current. Therefore, the bipolar mode Schottky devices fabricated by using EG/SiC heterojunction may be beneficial for high speed, fast switching device applications. (Amemiya, Yoshihito, and Yoshihiko Mizushima. "Bipolar-mode Schottky contact and applications to high-speed diodes." *IEEE Transactions on Electron Devices* 31.1 (1984): 35-42.) Additionally, the graphene/SiC Schottky barrier height can be altered in a controlled manner by tuning the graphene fermi level using molecular doping (Schedin, F., et al. "Detection of individual gas molecules adsorbed on graphene." Nature materials 6.9 (2007): 652-655, electric field, Tapaszto, Levente, et al. "Tuning the electronic structure of graphene by ion irradiation." *Physical Review B* 78.23 (2008): 233407, and hydrogen intercalation, Coletti, Camilla, et al. "Revealing the electronic band structure of trilayer graphene on SiC: An angle-resolved photoemission study." Physical Review B 88.15 (2013): 155439; Chava, Venkata S N, et al. "Epitaxial graphene (EG)/SiC based Schottky emitter bipolar phototransistors for UV detection and effect of hydrogen intercalation on device IV characteristics." *SENSORS, 2016 IEEE*. IEEE, 2016) etc., thus providing an additional control parameter for device operation.

Commercially available Si UV detectors require optical filters to block visible light and suffer from low UV responsivity. Accordingly, it is an object of the present invention to form a voltage tunable solar-blind UV detector using EG/SiC Schottky emitter bipolar phototransistor with EG grown on p-SiC epi-layer using a chemically accelerated Si etch process using TFS precursor. This may enable manufacture of solar-blind UV detectors with an absorption cutoff at 290 nm, ($\lambda$ cut-off <290 nm). Such high responsivity devices may become a potential alternative to existing UV detectors that require a large active area for the same responsivity.

SUMMARY OF THE INVENTION

In one embodiment, the current disclosure provides a bipolar junction transistor. The transistor includes an upper epitaxial graphene emitter layer, an intermediate p-SiC epilayer, and an $n^+$SiC substrate layer. Further, there is an epitaxial graphene/p-SiC Schottky junction. Even further, dopant concentration of the epilayer is p-type and may range from $3\times10^{14}$ cm$^{-3}$ to $4\times10^{14}$ cm$^{-3}$. Further yet, the transistor has a responsivity of substantially 17-25 A/W at $V_{CE}$=20 V. Furthermore, the upper epitaxial graphene emitter layer is transparent. Still further, the transistor includes detection and discrimination of ultraviolet radiation ranging from 200-400 nm without responding to UV radiation with $\lambda$>290 nm. Still yet further, the transistor has UV-visible rejection of >$10^3$. Further still, the p-SiC epilayer thickness is 13 µm. Even further, the thickness of the upper epitaxial graphene emitter layer is substantially 15 monolayers.

In an alternative embodiment, a method of forming a bipolar junction transistor is provided. The method includes growing a p-SiC epilayer on an $n^+$SiC substrate layer substrate via a CVD reactor; and growing an EG top electrode layer on the p-SiC epilayer using a Tetrafluorosilane gas precursor. A CVD reactor is employed and uses dichlorosilane and propane in hydrogen ambient at 300 Torr and 1600° C. The C/Si ratio is 1.9. Further, dopant concentration of the p-SiC epilayer may range from $3\times10^{14}$ cm$^{-3}$ to $4\times10^{14}$ cm$^{-3}$ and may be $3.7\times10^{14}$ cm$^{-3}$. Further still, the EG top electrode layer is grown on the p-SiC epilayer at 1600° C. and 300 Torr. Even further, a SiF$_4$ precursor in Argon is used to grow the EG top electrode layer on the p-SiC epilayer. Further yet, substantially circular graphene regions are defined using photolithography followed by O$_2$ plasma reactive-ion etching. Even further, the substantially circular graphene regions have a diameter of substantially 250 µm. Still further, the thickness of the EG top electrode layer is substantially 15 monolayers.

BRIEF DESCRIPTION OF THE DRAWINGS

The construction designed to carry out the invention will hereinafter be described, together with other features thereof. The invention will be more readily understood from a reading of the following specification and by reference to the accompanying drawings forming a part thereof, wherein an example of the invention is shown and wherein:

FIG. 3 shows at (b) current-voltage ($I_C$-$V_{CE}$) characteristics of a device of the current disclosure measured under dark and 250 nm and 300 nm UV illumination.

FIG. 3 shows at (c) scanning photocurrent maps (SPCM) of a EG/SiC phototransistor device of the current disclosure measured in SE mode, at $V_{CE}$=15 V and 20 V, under 444 nm illumination.

FIG. 4 shows at (b) and (c) the band diagrams for the EG/SiC bipolar phototransistor device of the current disclosure in the Schottky emitter (SE) mode operation at low and high collector-emitter bias voltages ($V_{CE}$), respectively.

FIG. 9 provides Table 1, a comparison of the performance metrics of a EG/SiC Schottky contact bipolar phototransistor of the current disclosure with other previously reported ultraviolet detectors.

Figure 1:
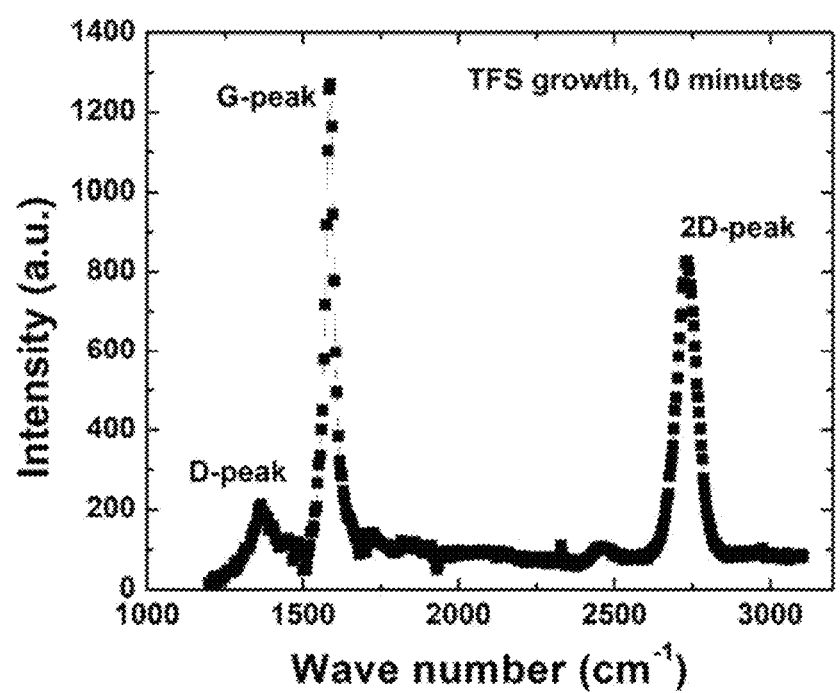
FIG. 1 shows experimentally measured Raman intensity spectra of graphene grown by selective etching of SiC epilayer using Tetrafluorosilane (TFS) gas precursor.

It will be understood by those skilled in the art that one or more aspects of this invention can meet certain objectives, while one or more other aspects can meet certain other objectives. Each objective may not apply equally, in all its respects, to every aspect of this invention. As such, the preceding objects can be viewed in the alternative with respect to any one aspect of this invention. These and other objects and features of the invention will become more fully apparent when the following detailed description is read in conjunction with the accompanying figures and examples. However, it is to be understood that both the foregoing summary of the invention and the following detailed description are of a preferred embodiment and not restrictive of the invention or other alternate embodiments of the invention. In particular, while the invention is described herein with reference to a number of specific embodiments, it will be appreciated that the description is illustrative of the invention and is not constructed as limiting of the invention. Various modifications and applications may occur to those who are skilled in the art, without departing from the spirit and the scope of the invention, as described by the appended claims. Likewise, other objects, features, benefits and advantages of the present invention will be apparent from this summary and certain embodiments described below, and will be readily apparent to those skilled in the art. Such objects, features, benefits and advantages will be apparent from the above in conjunction with the accompanying examples, data, figures and all reasonable inferences to be drawn therefrom, alone or with consideration of the references incorporated herein.

DETAILED DESCRIPTION OF A PREFERRED EMBODIMENT

With reference to the drawings, the invention will now be described in more detail. Unless defined otherwise, all technical and scientific terms used herein have the same meaning as commonly understood to one of ordinary skill in the art to which the presently disclosed subject matter belongs. Although any methods, devices, and materials similar or equivalent to those described herein can be used in the practice or testing of the presently disclosed subject matter, representative methods, devices, and materials are herein described.

Unless specifically stated, terms and phrases used in this document, and variations thereof, unless otherwise explicitly stated, should be construed as open ended as opposed to limiting. Likewise, a group of items linked with the conjunction "and" should not be read as requiring that each and every one of those items be present in the grouping, but rather should be read as "and/or" unless explicitly stated otherwise. Similarly, a group of items linked with the conjunction "or" should not be read as requiring mutual exclusivity among that group, but rather should also be read as "and/or" unless explicitly stated otherwise.

Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The current disclosure, in one embodiment, discloses an EG/SiC Schottky emitter bipolar phototransistor with a peak UV responsivity at 250 nm, using an epitaxial graphene (EG) emitter layer grown on p-SiC epilayer by selective etching of Si using TFS precursor. The high UV responsivity and gain observed in these devices is based on current transport by minority carrier electron injection across the EG/p-SiC Schottky junction. Epitaxial graphene growth on SiC using TFS may produce high-quality graphene layers, and may offer additional advantages in terms of high throughput and reduced costs. In a further embodiment, the current disclosure provides the operation of a TFS grown EG/SiC Schottky junction based bipolar phototransistor with voltage tunable responsivity for solar blind UV detection. Further, the EG/SiC bipolar phototransistors fabricated with EG grown by using TFS precursor showed reduced dark current along with high responsivity, Noise equivalent power (NEP) and specific detectivity (D*).

Fabrication and characterization details. For the EG/SiC Schottky junction bipolar transistor devices, the p-SiC epilayer may be grown on 8° offcut $n^+$-4H-SiC (0001) substrate. The p-SiC epilayer growth duration is 30 minutes and a C/Si ratio of 1.9 is maintained during the growth process. The pressure and temperature during the growth of these epilayers is maintained at 1600° C. and 300 Torr respectively. The growth rate for this process is found to be 25.6 μm/hr. The resultant doping for the p-SiC epilayer, as measured by mercury probe C-V technique, is found to be $3.7 \times 10^{14}$ cm$^{-3}$. However, dopant concentration may range from $3 \times 10^{14}$ cm$^{-3}$ to $4 \times 10^{14}$ cm$^{-3}$. The p-SiC epilayer thickness is 13 μm, as estimated from FTIR measurement data. However, p-SiC epilayer thickness may be varied from 0.1 μm-100 μm. The EG layers are grown on p-SiC epi-layers by selective etching of Si atoms at 1600° C. and 300 Torr, by flowing TFS gas for 10 minutes at a flow rate of 60 SCCM as described in Rana, Tawhid, et al. "Epitaxial growth of graphene on SiC by Si selective etching using SiF4 in an inert ambient." *Japanese Journal of Applied Physics* 54.3 (2015): 030304, which is hereby incorporated by reference. The G peak at 1350 cm$^{-1}$ in Raman intensity measurement, data confirms the presence of graphene and also the low $I_D/I_G$ (ratio of the intensities of D (defect) peak and G peak) shows the layers grown by this technique are good quality graphene. The thickness of the EG layers formed under the above conditions is estimated to be approximately 15 ML (1 ML=0.34 nm thick) from the XPS measurement data.

For the device fabrication, 250 μm circular graphene layers may be defined using photolithography followed by $O_2$ plasma reactive-ion etching (RIE) process. The SiC epilayers may not be mesa isolated, and this may result in additional leakage current for the device operation. Current-voltage (I-V) characteristics may be measured using a Keithley 2410 source measure unit (SMU) by illuminating the device at 365 nm using a variable power UV light source. The photoresponse measurements were performed using a monochromator with a Xe-arc lamp source, and the illumination wavelength is varied from 500 nm down to 250 nm. As described before, the photoresponsivity (R) is estimated as the ratio of photocurrent and the optical power incident on the device under study. The incident optical power ($P_{opt}$) is measured by using a Thorlabs UV enhanced Si photodiode.

Results and discussion. From the Raman spectra results for the epitaxial graphene layer grown on SiC epi-layer, a D/G ratio of <0.2 is obtained, indicating a high-quality graphene. A Schottky barrier height of 0.8 eV is estimated for EG/n-SiC Schottky diodes, fabricated in a similar procedure as EG/SiC bipolar phototransistors, from the dark current-voltage ($I_C$-$V_{CE}$). I-V measurement data is used to estimate the ideality factor and barrier height of the EG/n-SiC Schottky diodes. From this, the barrier height for EG/p-SiC Schottky diode is estimated as approximately 2.6 eV and is close to the barrier height for EG/p-SiC Schottky diode previously reported. (Anderson, Travis J., et al. "Ultraviolet detector based on graphene/SiC heterojunction." *Applied Physics Express* 8.4 (2015): 041301.), which is hereby incorporated by reference.

Figure 2:
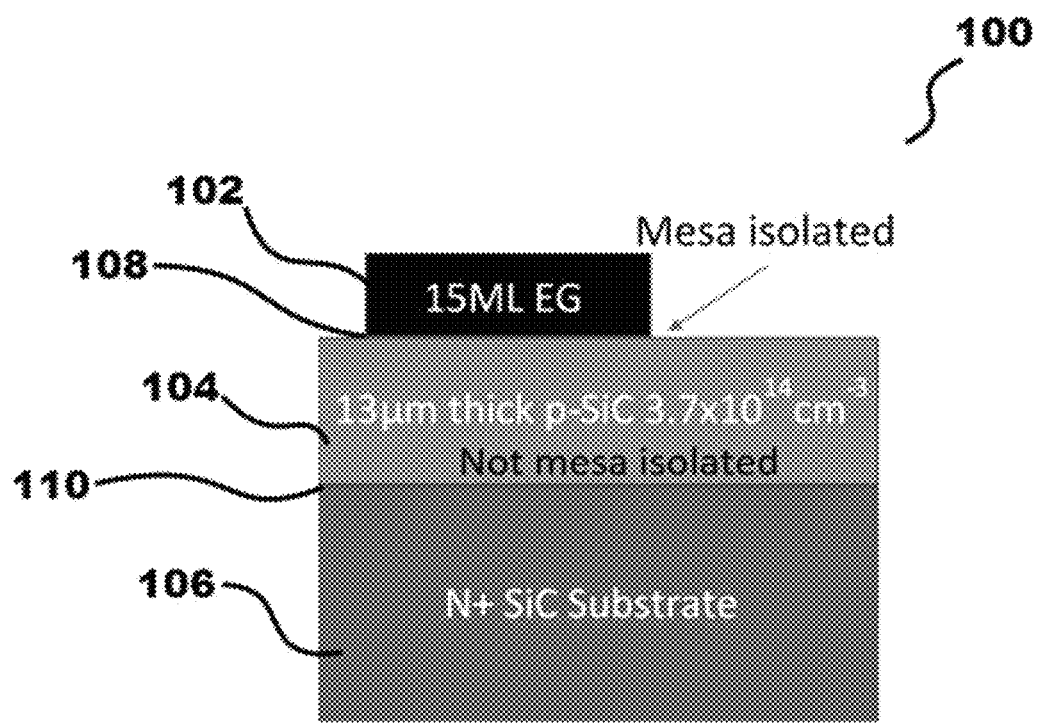
FIG. 2 shows a schematic of a cross sectional view of a EG/p-SiC/$n^+$-SiC vertical BJT device of the current disclosure.

FIG. 1 shows experimentally measured Raman intensity spectra of graphene grown by selective etching of SiC epilayer using Tetrafluorosilane(TFS) gas precursor. FIG. 2 illustrates a schematic of a cross sectional view of an EG/p-SiC/n$^+$-SiC vertical BJT device 100 structure. In one embodiment, device 100 may comprise three layers, an uppermost EG top electrode layer 102, which may only partially cover an intermediate p-SiC layer 104, and a bottom n$^+$SiC layer 106. There may also be a EG/p-SiC junction 108 and a p-SiC/n$^+$SiC junction 110.

In the present disclosure, when a layer is being described as "on" or "over another layer or substrate, it is to be understood that the layers can either be directly contacting each other or have another layer or feature between the layers, unless explicitly stated to the contrary. Thus, these terms are simply describing the relative position of the layers to each other and do not necessarily mean "on top of since the relative position above or below depends upon the orientation of the device to the viewer.

Figure 3:
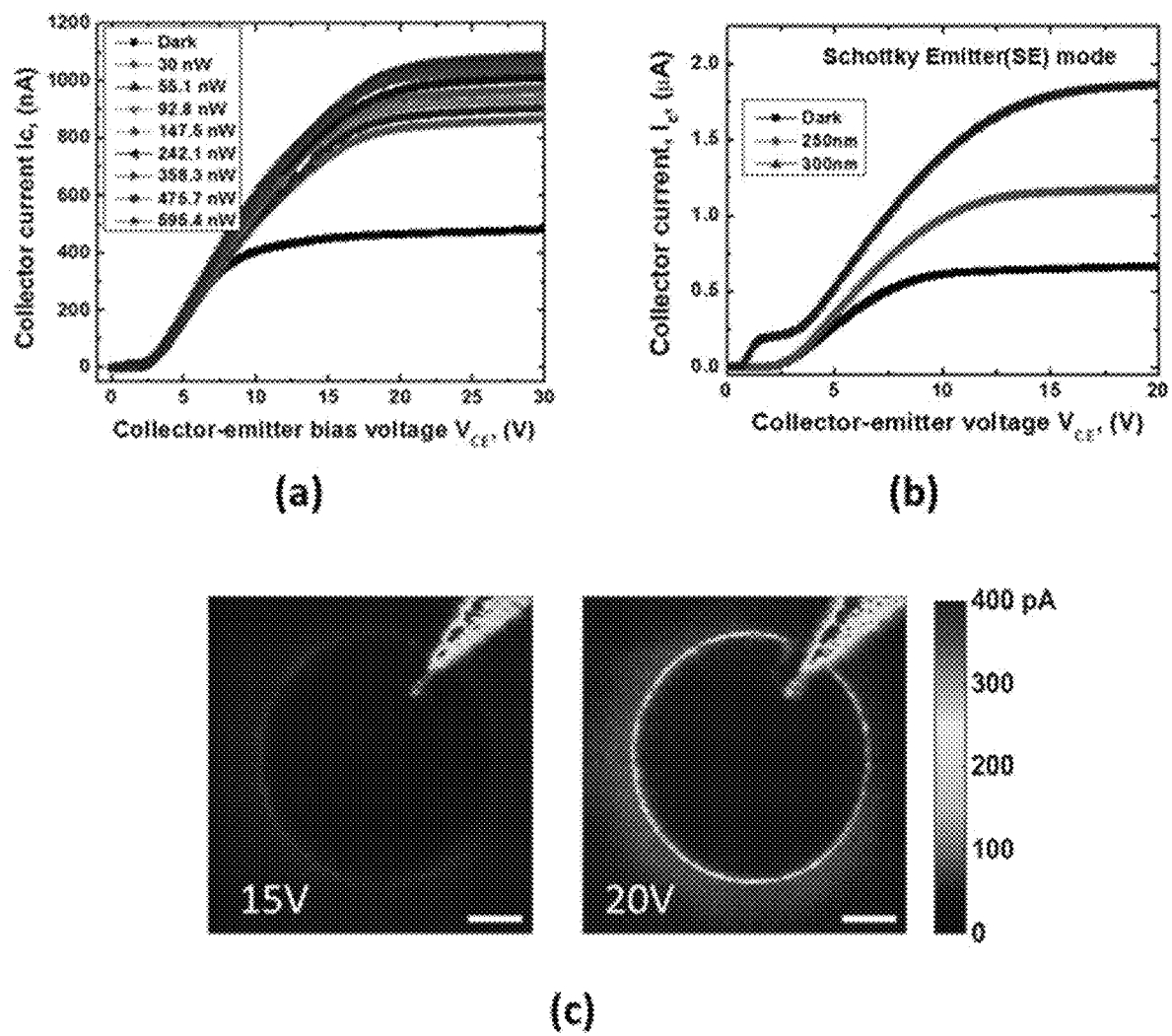
FIG. 3 shows at (a) variation in current-voltage ($I_{CE}$-$V_{CE}$) characteristics of a device of the current disclosure with UV power measured under 365 nm illumination.

FIG. 3 shows: (a) Variation in current-voltage ($I_C$-$V_{CE}$) characteristics of the device with UV power measured under 365 nm illumination; (b) current-voltage ($I_C$-$V_{CE}$) characteristics of the device measured under dark and 250 nm and 300 nm UV illumination; and (c) Scanning photocurrent maps (SPCM) of the EG/SiC phototransistor device measured in SE mode, at $V_{CE}$=15 V and 20 V, under visible light (444 nm laser) illumination. The scale bar in white is 50 μm. The current scale is shown in color on the right with a maximum current of 400 pA. FIG. 3 at (a) shows the collector current-voltage ($I_C$-$V_{CE}$) characteristics of the vertical bipolar transistor device in EG Schottky emitter mode or forward active mode with EG/p-SiC (E-B) junction forward biased and p-SiC/n$^+$-SiC (B-C) junction reverse biased, measured under 365 nm UV illumination. The base current for the open-base phototransistor operation is provided by UV light illumination on to the device. Collector current, $I_c$, may be measured as a function of UV power (or base current, $I_b$), by varying the UV power from 30 nW to 595 nW. It is clear that the measured collector current (I) increases with an increase in the collector-emitter bias voltage ($V_{CE}$). Also, the collector photocurrent ($I_c$)$_{ph}$, obtained by subtracting the collector current in dark from the collector current under illumination, increases with an increase in $V_{CE}$ (not shown here). This increase in $I_c$ (or ($I_c$)$_{ph}$) with $V_{CE}$ is attributed to the diffusion of electrons from p-SiC base to n$^+$-SiC collector which is a consequence of minority carrier electron injection from EG emitter to p-SiC base, and also decrease in quasi-neutral base width with a higher bias voltage that results in short base transit time ($\tau_n$) which is about 10 nSec as calculated from the equation:

$$\tau_n = \frac{W_D}{2D_n} \quad (1)$$

where $W_D$ is the neutral base width and $D_n$ is the diffusion coefficient of electrons in 4H-SiC. (Sze, Simon M., and Kwok K. Ng. *Physics of Semiconductor Devices*. John Wiley & Sons, 2006.), which is hereby incorporated by reference.

When the device is illuminated by a 365 nm UV lamp, the long wavelength UV photons are absorbed in the depletion region near the base-collector junction, thus creating e-h pairs which are separated by the electric field at this reverse biased B-C junction. These photo-generated electrons will be collected by the collector terminal and holes will be accumulated in the p-SiC base layer near the EG/p-SiC interface, due to large Schottky barrier height at this junction. Therefore, in order to maintain the charge neutrality in the base, minority carrier electron injection should occur from EG to p-SiC to compensate the positive charge of accumulated holes in the p-SiC base region, and thus resulting in a bipolar gain in these devices.

The origin for this minority carrier electron injection at E-B junction lies in the large Schottky barrier. The large Schottky barrier height 2.4 eV observed in devices of the present disclosure, as estimated from the I-V measurement data, also supports the minority carrier (electron) injection from EG to p-SiC. Under UV light illumination, there is always a non-zero collector current due to the e-h pairs generated near the reverse biased B-C depletion region, similar to the case of a photodiode.

Figure 4:
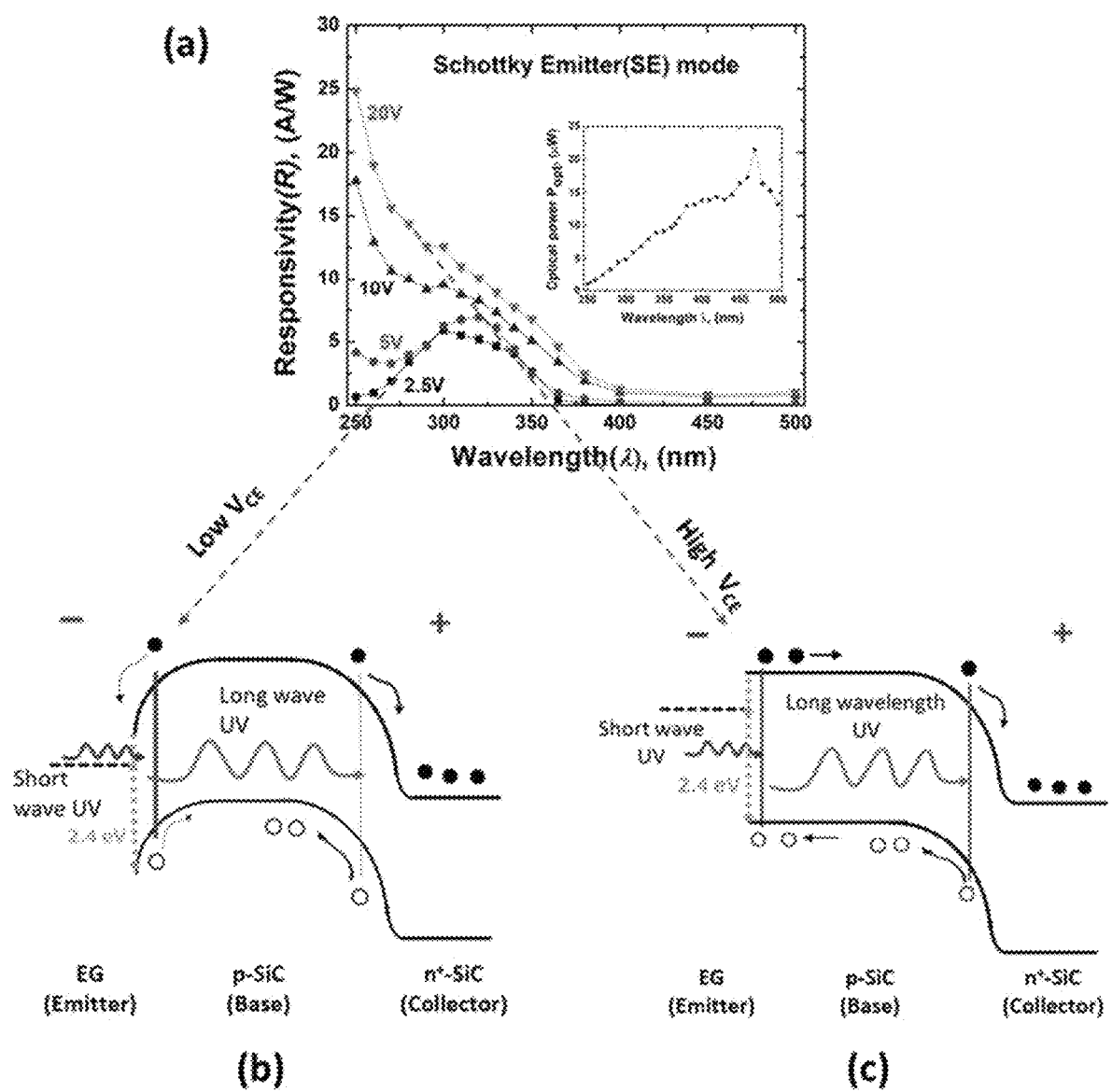
FIG. 4 shows at (a) estimated responsivity (R) as a function of illumination wavelength (λ) in the Schottky emitter (SE) mode measured at different bias voltages ($V_{CE}$) (inset shows the power of the Xe-arc lamp as a function of wavelength).

FIG. 4 shows: (a) estimated responsivity (R) as a function of illumination wavelength (λ) in the Schottky emitter (SE) mode measured at different bias voltages ($V_{CE}$) (inset shows the power of the Xe-arc lamp as a function of wavelength); (b) and (c) show the band diagrams of the EG/SiC bipolar phototransistor device in the Schottky emitter (SE) mode at low and high collector-emitter bias voltages ($V_{CE}$), respectively. FIG. 4 at (a), shows the experimentally measured responsivity as a function of wavelength from 250 nm to 500 nm, at different collector-emitter bias voltages ($V_{CE}$). Here, the photoresponsivity R (in A/W) is calculated as the ratio of collector photocurrent $(I_c)_{ph}$ to the power of the monochromatic light incident on the device. From this graph, it is evident that the responsivity of the device changes with both the incident light wavelength and the applied bias voltage ($V_{CE}$). For all illumination wavelengths (λ) from 250-500 nm, the photoresponsivity (R) is increased with increase in $V_{CE}$. By varying the incident light wavelength (λ), however, the responsivity (R) is either increased or decreased depending on the wavelength and applied bias voltage ($V_{CE}$). As the applied bias voltage ($V_{CE}$) is varied from 0-20 V, the wavelength corresponding to the peak responsivity (R) shifted from 320 nm to <250 nm. This shift in solar sensitiveness (high responsivity above 290 nm) to solar blindness (very low responsivity above 290 nm) with the applied voltage ($V_{CE}$) is an important feature that makes these devices suitable for SiC based solar blind UV detector applications.

For the light illumination above 290 nm, for all applied bias voltages, the responsivity is increased by lowering the wavelength of incident light up to 290 nm from 500 nm. Below 290 nm, it is observed that both wavelength of illumination light and applied bias voltage affects the variation in the spectral responsivity. For UV illumination between 290 nm-250 nm, as the wavelength of incident UV light is lowered, the responsivity increased up to 25 A/W at high $V_CE$ (20 V) whereas the responsivity decreased for low $V_{CE}$ for the same this wavelength range. The responsivity of a semiconductor photodetector, in general, varies as a function of its band-gap energy, wavelength dependent absorption coefficient, device structure etc. In addition, surface recombination could be a detrimental factor for the responsivity at short UV wavelengths, because the short wavelength UV photons get absorbed within a few microns of the SiC active absorption layer. Since 4H-SiC is an indirect bandgap semiconductor, it does not show a sharp cutoff in the absorption spectrum and the absorption coefficient (a) increases slowly as we decrease the illumination wavelength. In the literature, it is commonly observed that SiC-based solar blind UV detectors show a responsivity peak between around 270 nm irrespective of the bias voltage. (Chava, Venkata S N, et al. "Evidence of minority carrier injection efficiency>90% in an epitaxial graphene/SiC Schottky emitter bipolar junction phototransistor for ultraviolet detection;" *Applied Physics Letters* 108.4 (2016): 043502) and Chava, Venkata S N, Bobby G. Barker Jr, Anusha Balachandran, Asif Khan, G. Simin, Andrew B. Greytak, and M. V. S. Chandrashekhar. "High detectivity visible-blind SiF4 grown epitaxial graphene/SiC Schottky contact bipolar phototransistor." *Applied Physics Letters* 111, no. 24 (2017): 243504, which are hereby incorporated by reference. The present EG/SiC Schottky emitter bipolar phototransistor devices, however, show a different behavior in their spectral responsivity measured at different bias voltages ($V_{CE}$). Also, the UV-visible rejection ratio, measured as the ratio of responsivity ($R_{250}$) at 250 nm and responsivity ($R_{400}$) at 400 nm for this device at $V_{CE}$=20 V is found to be ~25.

The current disclosure explains the peak responsivity wavelength shift observed in devices of the current disclosure by using the energy band diagrams for the case of low and high $V_{CE}$, as shown at FIGS. 4(*b*) and (*c*). Here, the absorption of low and high energy UV photons is considered separately, as they pass through the device. The small energy or long wavelength UV photons due to long absorption length passes through the E-B junction, and gets absorbed in the base-collector region and thus creates e-h pairs at this junction, which can contribute to the total collector current ($I_c$). The high energy or low wavelength UV photons, on the other hand, are absorbed near the E-B junction, creating the electron-hole pairs at this interface. At low $V_{CE}$ (or $V_{BE}$), as shown in the band diagram, the E-B junction is NOT fully turned ON, and therefore the electron-hole pairs created at the E-B junction due to high energy UV photon absorption flow in a direction opposite to e-h pairs created at high $V_{CE}$ (or $V_{BE}$) when the emitter-base junction is fully ON. In other words, at low $V_{CE}$, the bipolar action is not observed due to absence of carrier injection from EG into p-SiC. Therefore, at low $V_{CE}$, a small collector current ($I_c$) and therefore a low responsivity (R) is observed. Also, the estimated surface recombination velocity at the EG/p-SiC interface is found to be of the order of $10^5$ cm/s indicating a high probability of recombination near the top EG surface.

Previously X. Chen et. al. (Chen, Xiaping, et al. "High-performance 411-SiC-based ultraviolet p-i-n photodetector." *Journal of Applied Physics* 102.2 (2007): 024505), which is hereby incorporated by reference, observed a similar decrease in responsivity at low bias voltages for UV-C photons. At high $V_{CE}$, on the other hand, the E-B junction is fully turned ON, thus the electrons created at this junction flow towards the base region and are collected by the collector terminal whereas the holes are accumulated in the base layer near the E-B interface leading to minority carrier injection from EG into p-SiC as explained supra. For the long wavelength photons, the responsivity (R) is increased with an increase in $V_{CE}$, and this is due to additional collector current obtained as a result of wider B-C depletion region formed at high reverse bias voltages.

As mentioned before, since SiC layers of the structure of the current disclosure are indirect bandgap, the absorption coefficient, a, is proportional to:

$$(E_{photo} - E_g)^2 / E_{photo} \quad (7)$$

where the incident photon energy, $E_{photo}$ (eV)=1241/λ (nm). Then, the photocurrent is given by $$I_{photo}(\lambda) = \frac{P_0(\lambda)[1 - \exp(-\alpha W)]}{E_{photo}} \quad (8)$$

where $P_0$ is the incident power at the given wavelength, and W is the width of the absorbing layer, which is the thickness of the p-epilayer. In terms of the responsivity, A, in A/W, this can be written as $$\ln\left(\frac{1}{1 - AE_{photo}}\right) = \alpha W \propto (E_{photo} - E_g)^2 / E_{photo} \quad (9a)$$

$$F = E_{photo}^{1/2}\left[\ln\left(\frac{1}{1 - AE_{photo}}\right)\right]^{1/2} \propto E_{photo} - E_g \quad (9b)$$

where we define F, the photocurrent absorption function on the LHS. Thus, a plot of F vs. $E_{photo}$ as shown in FIG. 4(*b*) gives a straight line with x-intercept $E_g$ corresponding to the bandgap of the dominant absorbing layer. This gives a threshold for photocurrent 3.26 eV, which corresponds to the bandgap of 4H-SiC.

The photocurrent of the device is also measured under a sub-bandgap blue laser (444 nm) light illumination by using scanning photocurrent microscope (SPCM) technique. In this technique, the photocurrent maps are generated by measuring the photocurrent locally by raster scanning the laser beam across the device area. The inset in FIG. 4(b), shows the photocurrent map of the device measured at 15 V and 20 V in EG emitter mode and from these photocurrent maps it is clear that the photocurrent for this device is less than 1 nA, and well below the photocurrent levels measured under UV light illumination. The SPCM result also confirms the absence of electrically active structural defects such as stacking faults usually observed in SiC, and supports the high UV-visible rejection ratio observed from the responsivity measurements. This low non-negligible photocurrent (<1 nA) observed in this case can be attributed to the absorption of the sub-bandgap blue photons by donor acceptor pairs (DAP) in the p-SiC base epilayer. (Sullivan, J. S., and J. R. Stanley. "611-SiC photoconductive switches triggered at below bandgap wavelengths." *IEEE Transactions on Dielectrics and Electrical Insulation* 14.4 (2007).), which is hereby incorporated by reference.

Summary. The current disclosure provides, for the first time, a voltage tunable solar-blind UV detector using EG/SiC heterojunction based Schottky emitter bipolar phototransistor, with EG grown on p-SiC epi-layer using a chemically accelerated growth process using TFS precursor. It is observed that the wavelength corresponding to peak responsivity is shifted from 320 nm to less than 250 nm with the applied bias voltage ($V_{CE}$). The current disclosure explains this peak responsivity wavelength shift using the applied bias voltage ($V_{CE}$) and the wavelength dependent absorption coefficient. From the photocurrent mapping using SPCM technique, no evidence for the electrically active defects is observed in the active layers for the device used in present study. Finally, these high responsivity devices may become a potential alternative to the existing UV detectors where they require a large active area for the same responsivity.

In one embodiment of the current disclosure, a single bipolar phototransistor may be used to distinguish UV bands by using voltage to tune the peak responsivity wavelength. Silicon Carbide, a wide bandgap material, is suitable for detecting all 3 UV bands due to its favorable bandgap of ~3.26 eV or 380 nm. In addition, it can operate in high temperature and harsh environment conditions, due to high radiation and chemical hardness. Further, Transparent Epitaxial Graphene (EG) contact electrode based SiC UV detectors avoid reflection/absorption losses at the top.

The current disclosure provides for the fabrication and characterization of a UV detector based on a vertical bipolar transistor structure with EG emitter, $3.7 \times 10^{14}$ cm$^{-3}$ p-SiC base 13 μm thick, and n$^+$SiC collector with voltage tunable solar blindness. The EG emitter layer used for fabricating these detectors are grown in a CVD, Chemical Vapor Deposition, reactor using a novel Tetrafluorosilane(TFS) gas precursor, and represents the first EG/SiC Schottky junction devices reported using this synthesis technique.

Figure 5:
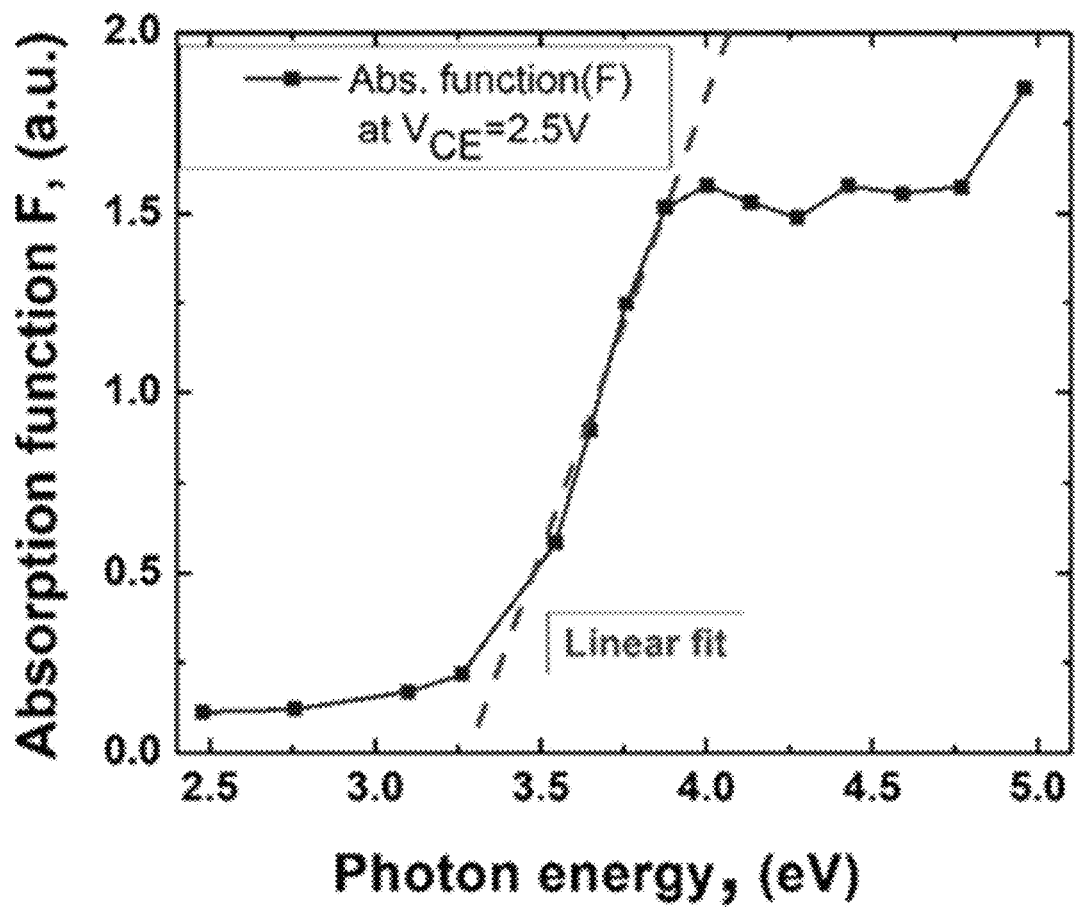
FIG. 5 illustrates a plot showing the variation in absorption function (F) as a function photon energy ($E_{photon}$) for $V_{CE}$=2.5 V.

FIG. 5 shows a plot showing the variation in absorption function (F) as a function photon energy ($E_{photon}$) for $V_{CE}$=2.5 V. The linear fit of this curve (shown by the dashed line) intercepts the photon energy axis at 3.25 eV which is the energy bandgap for 4H-SiC. With respect to FIG. 5, from the I-V characteristic results, it is clear that photocurrent is increased when the collector-emitter bias voltage, $V_{CE}$, is increased due to forward biasing at the emitter-base (E-B) junction. The origin for bipolar action which results in high current gain and responsivity for these devices lies in the minority carrier injection across EG/p-SiC Schottky interface. From the estimated spectral photoresponsivity for wavelengths between 250-500 nm, it is clear that the responsivity of these devices decreases with increase in wavelength, and the responsivity is maximum near 250 nm and drops off sharply near 380 nm i.e. the band-gap edge of 4H-SiC.

With respect to FIG. 5, from the I-V characteristic results, it is clear that photocurrent is increased when the collector-emitter bias voltage, $V_{CS}$, is increased due to forward biasing at the emitter-base (EB) junction. The origin for bipolar action which results in high current gain and responsivity for these devices lies in the minority carrier injection across EG/p-SiC Schottky interface. From the action spectrum from 250-500 nm, it is clear that the responsivity of these devices decreases with increase in wavelength, and the responsivity is maximum near 250 nm and drops off sharply near 380 nm i.e. the band-gap edge of 4H-SiC.

At low $V_{CE}$, the high energy cutoff is at 280 nm, while at high $V_{CE}$, it cuts off below 250 nm, with the responsivity at 250 nm varying from 0.7 A/W at $V_{CE}$=2.5 V to 25 A/W at $V_{CE}$=20 V. This voltage-tunable wavelength selectivity is due to DUV absorption at low $V_{CE}$ in the depletion region at the E-B (EG/p-SiC) junction that serves as a filter that absorbs high energy light, and therefore does not contribute to the collector current. At high $V_{CE}$, the E-B junction is forward biased, and there is no depletion region, enabling e-h pairs from short wavelength UV light to be collected and contribute to the collector current. In other words, the bias voltage dependent responsivity allows one to operate this device as a voltage tunable band-pass UV detector, that can respond separately to both UV-B and UV-C bands by changing the bias voltage.

In a further embodiment, Epitaxial Graphene/SiC heterojunction based Schottky contact bipolar phototransistor devices are fabricated and characterized under UV light in the forward active mode. From the action spectra measurements, bias voltage tunable spectral photoresponse is observed. The current disclosure manufacturing process designs and fabricates solar blind SiC UV detectors without the need for additional expensive optical filters. Further, the voltage tunable responsivity in Schottky emitter mode allows these devices to be used as a high pass filter for the UV-C radiation. Additionally, the device structure uses transparent conductive epitaxial graphene layer as an emitter layer on the top, essentially eliminating the metal contact electrodes used in conventional photodetectors, and therefore minimizes the material and fabrication costs. Epitaxial graphene can be grown in large areas by using the selective etching of Si by TFS gas precursor with better quality and higher growth rate compared to the existing large area graphene growth processes, and therefore results in a higher throughput while minimizing the production costs. Moreover, products created from the manufacturing process, such as epitaxial graphene/SiC based devices, may work well under harsh environmental conditions and also longer UV exposures since both EG and SiC have high mechanical strength due to strong chemical bonding.

In summary, the current disclosure provides a voltage tunable solar-blind UV detector using EG/SiC heterojunction based Schottky emitter bipolar phototransistor, with EG grown on p-SiC epi-layer using a chemically accelerated TFS precursor. A peak wavelength responsivity shift with wavelength from 320 nm to less than 250 nm is observed depending on the applied bias voltage. This peak responsivity wavelength shift may be explained by considering the effect of bias voltage ($V_{CE}$) and also the wavelength dependent absorption coefficient on generation and collection of charge carriers in the device. From the photocurrent mapping using SPCM technique, no evidence for the electrically active defects is observed in the active layers for the device used in present study. Finally, these high responsivity devices may become a potential alternative to the existing UV detectors where they require a large active area for the same responsivity.

The devices of the current disclosure allows detection and discrimination of ultraviolet (UV) radiation ranging from 200-400 nm emitted from various UV sources. This invention also allows detection of the UV-C radiation (200-280 nm) without responding to the UV radiation reaching earth's surface from the sun, i.e., $\lambda>290$ nm, thus enabling solar blind UV detection. The current disclosure allows the replacement of the metal electrodes used in conventional SiC UV detectors with a highly transparent and electrically conducting graphene layer, leading to better output responsivity under low UV signal conditions. This invention demonstrates some potential applications of this technology in electronic and optoelectronic devices for UV monitoring, flame sensing, missile plume detection, gas sensors, etc.

These high responsivity detectors with high intrinsic bipolar transistor gain are particularly useful for UV sensing in conditions such as low UV signal and harsh/high-temperature environments. The bandgap of 4H-SiC is about 3.26 eV corresponding to an absorption wavelength cutoff at 380 nm and as a consequence normal SiC UV detectors are sensitive to all regions of the UV radiation below 380 nm. Further, in earth's atmosphere, there always exists some portion of UV-A and UV-B radiation coming from solar radiation, which might result in a false alarm if the UV detector in use is not solar-blind. The voltage tunable solar blindness in the devices produced pursuant to the current disclosure, however, allows one to detect wavelengths below 290 nm radiation easily and do not produce any measurable output under normal outdoor lighting conditions.

In a further embodiment, an ultraviolet (UV) detector may be developed using an epitaxial graphene/SiC heterojunction based bipolar phototransistor with graphene/p-SiC/n$^+$-SiC layers in that order as an emitter, base, and collector layers respectively. The transparent Epitaxial Graphene (EG) emitter layer used in fabricating these devices may be grown by selective etching of SiC surface using a novel Tetra-Fluoro-Silane (TFS) gas precursor and these devices represent the first devices of their kind fabricated using graphene grown by this synthesis technique. The high quality of these graphene layers as confirmed by Raman suggests that this growth technique may be used as an alternative to existing graphene growth technologies. For the EG/SiC Schottky diode grown using TFS precursor, a Schottky barrier height 0.8 eV is estimated (Chava, Venkata S N, Bobby G. Barker Jr, Anusha Balachandran, Asif Khan, G. Simin, Andrew B. Greytak, and M. V. S. Chandrashekhar. "High detectivity visible-blind SiF$_4$ grown epitaxial graphene/SiC Schottky contact bipolar phototransistor." *Applied Physics Letters* 111, no. 24 (2017): 243504.), which is hereby incorporated by reference, and these Schottky devices are suitable for high power and high speed electronic and optoelectronic applications. Further, the measured current-voltage ($I_c$-$V_{CE}$) characteristics of these open base bipolar phototransistors in Schottky emitter mode under variable UV illumination power show a high bipolar gain and high photoresponsivity (R) better than those of existing UV detector technologies, which is an important performance metric for applications that operate in low UV signal conditions.

Further, the measured responsivity action spectra result shows that the devices of the current disclosure have high UV-visible rejection ratios and their responsivity varies as a function of the applied collector-emitter bias voltage. At low bias voltages, the emitter-base junction current and base-collector junction current flow in opposite direction resulting in lower responsivity in comparison to responsivity at high bias voltages where the emitter-base junction is fully turned ON. This voltage tunable responsivity at low UV wavelengths allows this device to act as a filter for UV-B (280-315 nm) and UV-C (200-280 nm) wavelengths.

Still further, the current disclosure provides a voltage tunable solar-blind UV detector using an EG/SiC heterojunction based bipolar phototransistor where EG is grown on SiC (0001) epilayer, using Tetrafluorosilane(TFS) to chemically accelerate the removal of Si. In the Schottky emitter (or forward active mode), the EG/p-SiC (13 μm)/n$^+$-SiC phototransistor device showed responsivity as high as 25 A/W at 250 nm, corresponding to a peak bipolar current gain >120. The peak responsivity wavelength changed from 320 nm to <250 nm with varying collector-emitter voltage 0 to 20 V, moving from solar sensitivity to solar blindness. This was analytically shown to be due to modulation of the emitter-base depletion region which functioned as a shortwave filter. Electron-hole pairs generated here recombine at the EG/SiC interface near the surface, due to a measured interfacial recombination velocity of >10$^5$ cm/s, whereas excellent charge collection is seen at the SiC base collector p-n junction, leading to bipolar gain of carriers generated well below the surface. Sub-bandgap scanning photocurrent maps (SPCM) showed that these devices had no stacking faults, indicating that the observed behavior is due to the nominal device structure, and not parasitic ingrown quantum wells.

Whereas prior attempts at forming EG/SiC based UV detectors with improved responsivities were attempted by reducing the reflection/absorption losses at the detector surface. The EG/SiC Schottky emitter phototransistor (SEPT) reported showed high R=7 A/W at 365 nm due to minority electron injection from EG into p-SiC leading to high bipolar gain. However, this device suffered from large dark current due to the lack of base/collector junction mesa isolation and poor visible rejection <10$^2$ at 400 nm. Moreover, this device did not show appreciable gain in the Schottky collector (SC) mode. These characteristics are impractical for post-Si detection applications. Chava, Venkata S N, et al. "Evidence of minority carrier injection efficiency>90% in an epitaxial graphene/SiC Schottky emitter bipolar junction phototransistor for ultraviolet detection;" *Applied Physics Letters* 108.4 (2016): 043502, which is hereby incorporated by reference, wherein graphene is grown by a thermal sublimation method not by a TFS precursor.

The current disclosure could be licensed to companies that are looking for improved performance metrics (such as high gain, responsivity, low noise equivalent power and high detectivity, etc.) and are seeking to fabricate solar blind SiC UV detectors. This may include photodetectors, gas sensors, flame detectors manufacturers, etc., and also companies working on defense and optical communication applications.

The current disclosure uses a bipolar junction transistor (BJT) device similar to that reported in, V. S. N. Chava, S. U. Omar, G. Brown, S. S. Shetu, J. Andrews, T. S. Sudarshan, and M. V. S. Chandrashekhar, *Applied Physics Letters* 108, 043502 (2016), which is hereby incorporated by reference, having an EG/p-SiC/n$^+$-SiC structure with a thinner SiC base (13 µm) to improve the base transit factor and hence collection of the minority carrier injected by bipolar action. EG was grown using a SiC homoepitaxy-compatible SiF4 gas precursor. The device of the current disclosure showed significantly improved performance in both Schottky emitter (SE) and Schottky collector (SC) modes. The current disclosure provides comprehensive characterization of the EG/SiC phototransistor including spectral responsivity, speed, noise equivalent power (NEP), and detectivity and shows that it compares well with other visible-blind devices reported in the literature.

For the phototransistor device fabrication, the 13 µm thick p-SiC base epilayer is grown on an 8° offcut n$^+$-4H-SiC (0001) substrate by a CVD reactor using dichlorosilane (DCS) and propane in hydrogen ambient at 300 Torr and 1600° C. at a C/Si ratio of 1.9, giving a growth rate of approximately 26 µm/h for 30 min, producing a 13 lm thick film as determined by Fourier transform infrared reflectance (FTIR). However, the C/Si ratio may range from 1.5 to 1.9. The resultant doping of the epilayer, due to site-competition epitaxy, was found to be p-type $3.7 \times 10^{14}$ cm$^{-3}$ by the Hg probe capacitance-voltage (C-V) measurement. This thickness was based on the inventors' previous work, V. S. N. Chava, S. U. Omar, G. Brown, S. S. Shetu, J. Andrews, T. S. Sudarshan, and M. V. S. Chandrashekhar, *Applied Physics Letters* 108, 043502 (2016), which is hereby incorporated by reference, where a diffusion length of approximately 10 µm was measured in the 30 lm base. For the current disclosure, to improve the base transit factor and hence the current gain, a thinner SiC epilayer was used, although this always comes at the expense of lower light absorption for long wavelengths. To achieve reasonable absorption in the range of 250-400 nm, while maintaining adequate current gain, the 10 µm base thickness range was chosen, with the resultant 13 µm base obtained for standard 30 min growth.

The EG top electrode layer is then grown on the SiC base at 1600° C. and 300 Torr, in the same reactor, using the SiF$_4$ precursor in Argon for 10 min using a chemically accelerated Si-removal process, as described in T. Rana, M. V. S. Chandrashekhar, K. Daniels, and T. Sudarshan, *Japanese Journal of Applied Physics*, Part 1 54, 30304 (2015), which is hereby incorporated by reference. From FTIR and X-ray photoelectron spectroscopy, the thickness of the EG is estimated to be ~15 monolayers for these growth conditions. Further, EG thickness can be varied from 1 ML to 20 ML, with thinner constructs being preferred. Circular graphene regions of diameter 250 µm are defined for the device, using photolithography followed by O$_2$ plasma reactive-ion etching (RIE).

Figure 7:
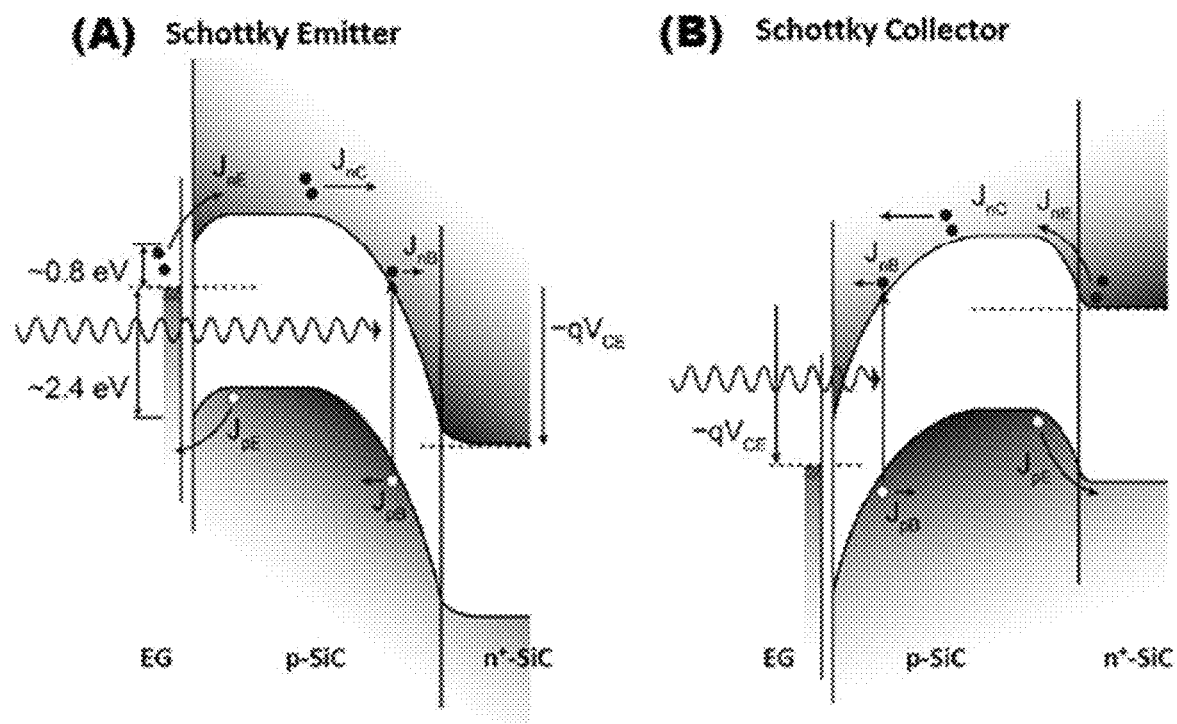
FIG. 7 shows energy band diagrams showing a phototransistor device of the current disclosure in operation in the Schottky emitter (SE) mode (A) and Schottky collector (SC) mode (B) under light illumination.
Figure 8:
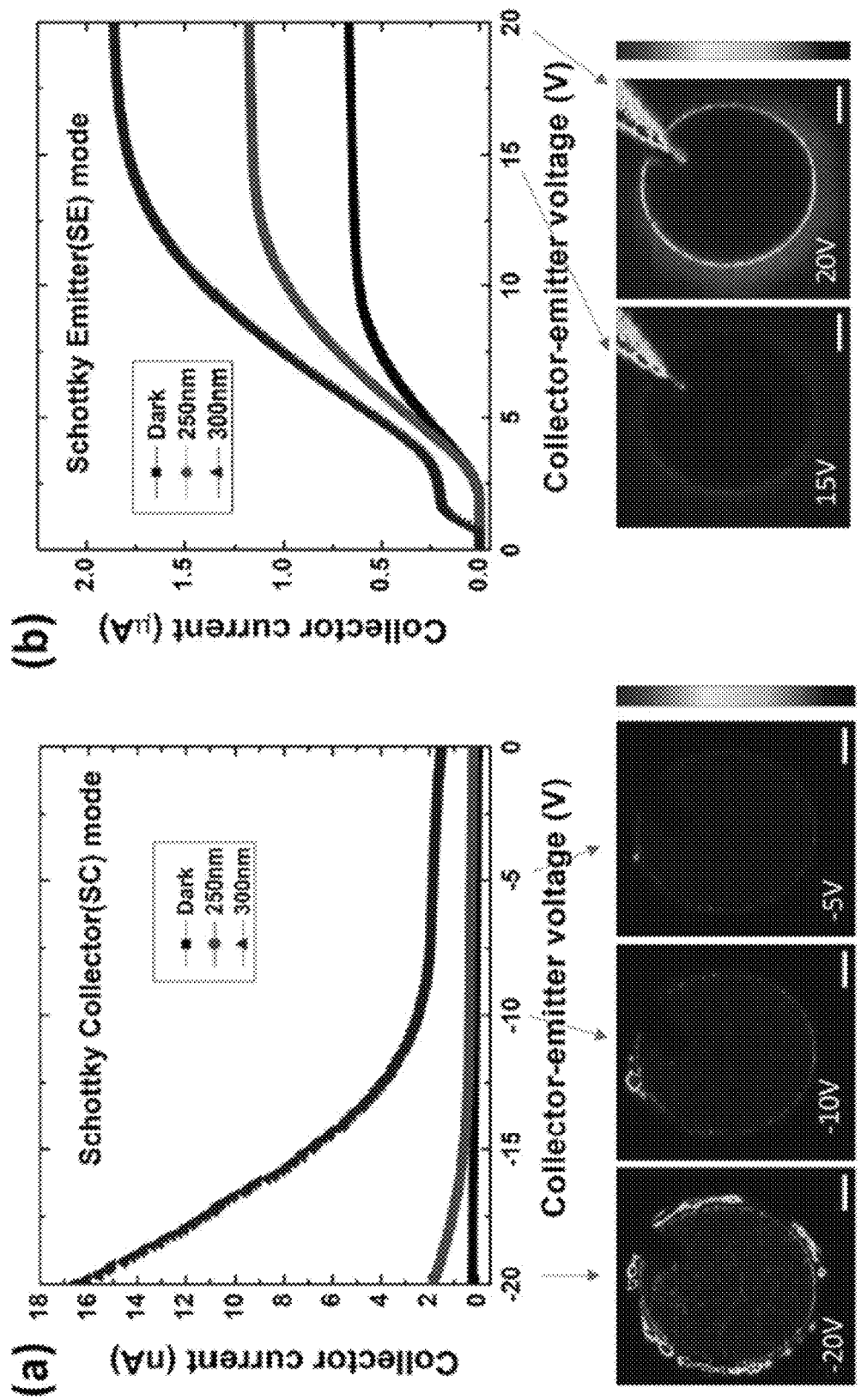
FIG. 8 shows experimentally measured dark and light current-voltage (Ic-$V_{CE}$) characteristics and the relative scanning photo-current maps (SPCM) of a device of the current disclosure [at different bias ($V_{CE}$) voltages] under 444 nm laser illuminations in SE (a) and SC (b) modes.

FIG. 2 shows the schematic of one embodiment of a vertical bipolar phototransistor device using EG/p-SiC/n$^+$-SiC layers. FIG. 7 at (A) shows energy band diagrams showing the phototransistor device operating in Schottky emitter (SE) and at (B) shows the device operating in Schottky collector (SC) mode under light illumination. The device is operated in two different modes, namely, Schottky emitter (SE) and Schottky collector (SC) based on the polarity of the bias applied at the top EG layer. The device may be operated in the SE mode, when the EG/p-SiC junction is forward biased and the p-SiC/n$^+$-SiC junction is reverse biased [FIG. 7 at (A)]. On the other hand, the device may operate in the SC mode when the EG/p-SiC junction is reverse biased and the p-SiC/n$^+$-SiC junction is forward biased [FIG. 7 at (B)]. When the device is illuminated with light from above, e-h pairs will be created due to photon absorption in SiC. These e-h pairs will be separated by the electric fields in the base-collector depletion regions in SE and SC modes. Schottky barrier height for the EG to n-SiC is 0.8 eV, as measured by I-V on EG/n-SiC Schottky test structures, and is higher than the 0.5 eV barrier height reported for thermally grown EG/SiC junctions. FIG. 8 shows experimentally measured dark and light current-voltage (Ic-V$_{CE}$) characteristics and the relative scanning photo-current maps (SPCM) of a device of the current disclosure [at different bias (V$_{CE}$) voltages] under 444 nm laser illuminations in SE (a) and SC (b) modes. For SPCM maps, the scale bar is 50 µm and the current scale is shown on the right, with a maximum photocurrent value of 400 pA.

Figure 6:
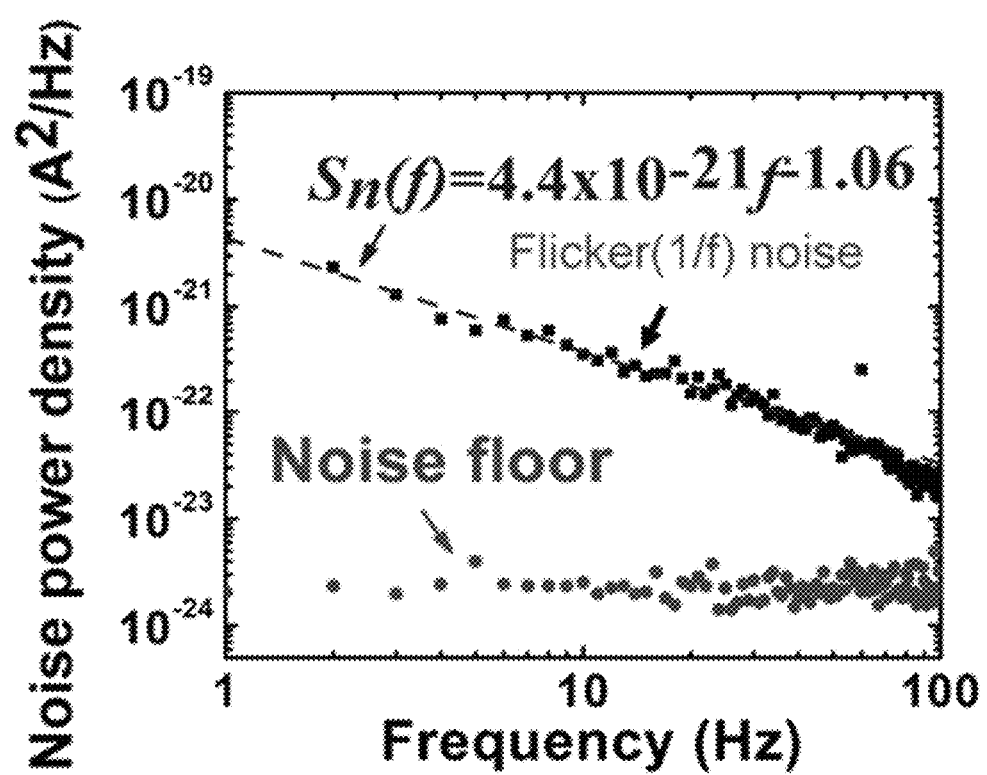
FIG. 6 shows experimentally measured noise spectrum of a device of the current disclosure at $V_{CE}$=20 V in the Schottky Emitter (SE) mode in the frequency range of 1-100 Hz.

The current-voltage (Ic-V$_{CE}$) characteristics of devices of the current disclosure are measured in the dark and under light for both SC, FIG. 8 at (a) and SE, FIG. 8 at (b), modes, by illuminating the device with light of various wavelengths using a monochromatic light source (10 nm bandpass), from which the action spectra are reconstructed. Dark currents of 230 pA and 670 nA are observed in SC and SE modes at 20 V. The significantly larger dark current in the SE-mode is due to the lack of mesa isolation at the 10 µm deep backside SiC p-n junction, which is 1 cm$^2$, compared to the ~$4.9 \times 10^{-4}$ cm$^2$ area of the graphene/SiC Schottky top junction, see FIG. 2, leading to a corresponding increase in the leakage area. However, the dark current in the SE-mode devices, 670 nA, was still 3 orders of magnitude lower than 100 µA observed in previous EG/SiC BJT devices with 30 µm thick p-SiC base. The current disclosure attributes this decrease to the significant optimization of SiC epitaxy which has led to defect reduction in the epilayers. Mesa-isolation of the base-collector SiC p-n junction should significantly reduce the dark current in the SE mode to values comparable to SiC p-n diodes see FIG. 9, Table I, which are among the lowest of any wide bandgap UV detectors. FIG. 9 shows Table 1, EG/SiC phototransistor performance metrics compared to previously reported ultraviolet detectors. FIG. 9 shows a plot for the comparison of spectral responsivity of the phototransistor device in SE and SC modes of operation at V$_{CE}$=20 V from 250 to 450 nm. The inset shows the measured noise spectrum of the device at V$_{CE}$=20 V in the Schottky Emitter (SE) mode in the frequency range of 1-100 Hz as shown in FIG. 6.

Clear bipolar phototransistor action is seen in both SC and SE-modes. In the SE-mode, the current increases starting at V$_{CE}$=2 V, in agreement with the 2.4 eV p EG/SiC Schottky barrier estimated above, see FIG. 2). For the SC-mode, the bipolar behavior is seen until V$_{CE}$~10 V beyond which the photocurrent increases sharply due to avalanche effects from the electric field concentration at the reverse-biased EG/SiC Schottky barrier periphery. In the SE-mode, there is no periphery due to the lack of mesa-isolation, so avalanche breakdown at the device periphery is not seen. This assertion is clearly supported by scanning photocurrent microscopy (SPCM) maps at 444 nm, see FIG. 8, where "hot-spots" are seen in the SC-mode at the periphery that increase in prominence at higher VCE, in concurrence with the sharp current increase in the photocurrent, whereas similar features are not observed in the SE-mode. The uniform ring/halo at the device edge in the SE-mode is due to non-specular scattering at that edge, leading to greater photocurrent in the non-mesa isolated SiC p-n junction collector. It is evident, however, that the hot-spots seen in the SC-mode are not visible in the SE mode, showing that the sharp increase in current in the SC mode at V$_{CE}$>10 V is due to avalanche from the device periphery. This avalanche effect may be minimized by using field-plate techniques, as known to those of skill in the art, although careful engineering may allow it to be exploited as in avalanche photodiodes.

In the SE-mode Ic-$V_{CE}$ curves under illumination, see FIG. 8, a small hump is seen near ~0.7 V, which is attributed to the presence of a Schottky barrier height from the edge, in addition to the larger one from the bulk, see FIG. 2. As the emitter-base junction turns on, the influence of the parasitic smaller barrier is eventually overwhelmed by the bulk owing to the much larger area associated with the higher barrier. This could be due to independent contributions from bulk and periphery of the graphene contact, in analogy to SC mode results where edge and bulk clearly give independent contributions.

Figure 10:
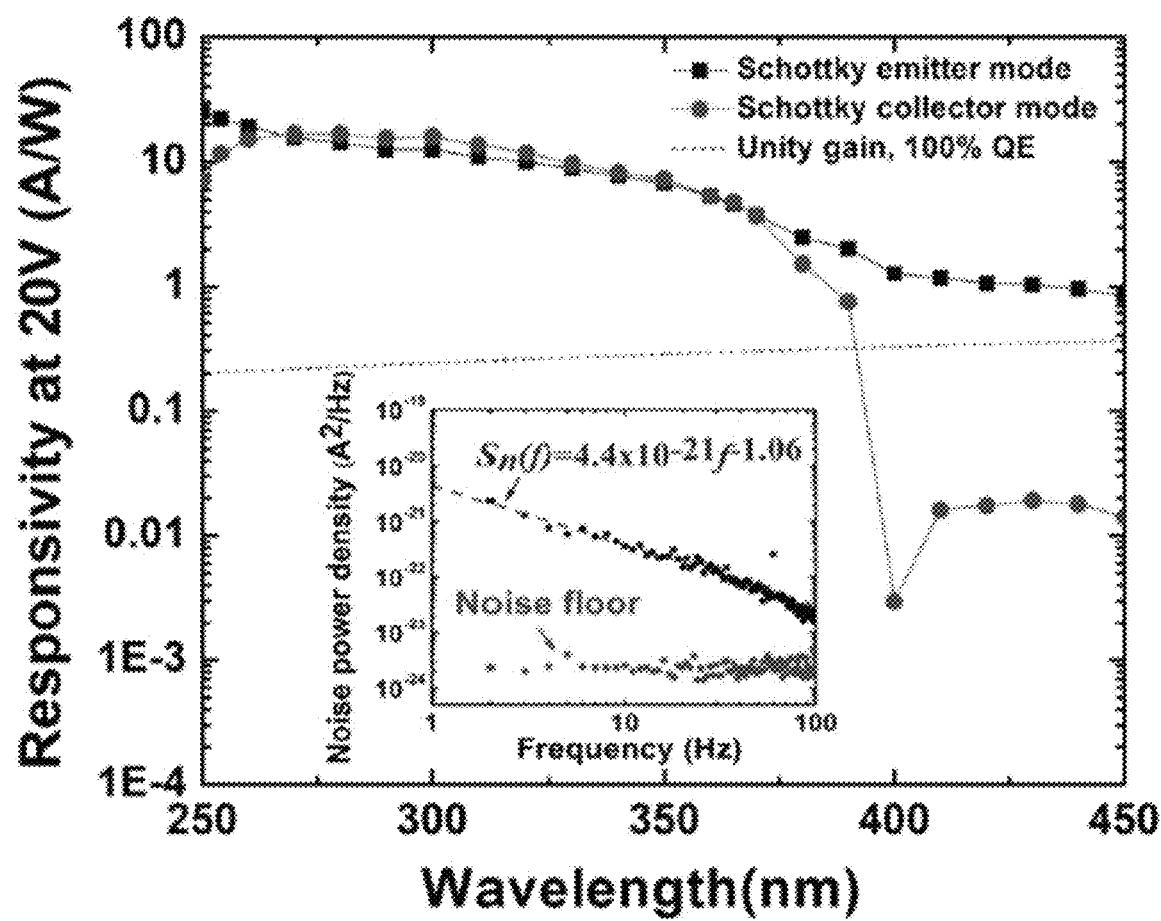
FIG. 10 shows a plot for the comparison of spectral responsivity of a phototransistor device of the current disclosure in SE and SC modes of operation at $V_{CE}$=20 V from 250 to 450 nm.

Larger absolute photocurrents are seen in the SE-mode, again due to the lack of mesa-isolation in the SE-mode, since the circular spot size of the light from the spectrometer is ~1 cm$^2$. This means that in the SE-mode, the e-h pair collection area is $>>4.9\times10^{-4}$ cm$^2$ of the graphene/SiC junction, whereas it will be comparable to this area in the SC-mode, leading to the apparent large difference in photocurrents, despite the similar absolute responsivities, R($\lambda$), reported in FIG. 10. FIG. 10 shows a plot for the comparison of spectral responsivity of the phototransistor device in SE and SC modes of operation at $V_{CE}$=20 V from 250 to 450 nm. The inset, which may be seen larger at FIG. 6, shows the measured noise spectrum of the device at $V_{CE}$=20 V in the Schottky Emitter (SE) mode in the frequency range of 1-100 Hz. R($\lambda$) is defined as the ratio of the observed photocurrent (difference of current under illumination and in the dark) to the optical power incident on the device. The dependence of R on wavelength ($\lambda$) was measured under wide area illumination by comparison to a calibrated Si photodiode. To account for the difference in the collection area discussed above, the absolute responsivity, R, was calibrated to measurements performed at 365 nm with illumination through a microscope focused to an area<the device area. The R($\lambda$) values are higher than expected from 100% quantum efficiency (dashed line in FIG. 10) for above bandgap (~390 nm for SiC) light illumination, indicating current gain in both SE and SC-modes. A peak R (250 nm)=25 A/W is observed in the SE-mode which corresponds to current gain g>120, as given by $$R(\lambda) = \frac{\lambda \eta}{hc} qg = \frac{\lambda(nm)}{1.24 \times 10^3} g, \qquad (10)$$

where R is the measured responsivity (in A/W), $\lambda$ is the incident light wavelength, h is Planck's constant, c is the light velocity, and q is the electron charge, where we assume a quantum efficiency, =1, to estimate a lower bound on g in the final expression in (10). In the SC-mode, a peak R (270 nm)=17 A/W is measured, corresponding to g>78 although as discussed above, this is due to a combination of bipolar gain and avalanche gain from the device periphery at $V_{CE}$=20 V. At $V_{CE}$<10 V, avalanche gain from the periphery is effectively suppressed, and R is also reduced, leading to bipolar current gain, g~10. In the SC-mode, the short absorption lengths in SiC (~1 µm at 270 nm) for short wavelength photons result in lower R due to the recombination of the photogenerated carriers at the EG/SiC Schottky collector junction. In a long-base bipolar device, where we assume a minority carrier injection efficiency of ~1 and that g is limited by base transit, we estimate the recombination time, $\tau_{rec}$, from $$g \approx \frac{2D_n \tau_{rec}}{W_{QNR}^2}, \qquad (11)$$

where $W_{QNR}$, is the quasi-neutral region width at a given voltage from the difference in the base-width and the depletion region at the collector side, and $D_n$=23 cm$^2$/V s is the diffusivity of electrons in SiC. This leads to, $\tau_{rec}$~20 ns in both SE and SC-modes. In the SC-mode, the recombination velocity, S, at the EG/SiC interface is estimated from $W_{QNR}$/$\tau_{rec}$~10$^5$ cm/s at $V_{CE}$=10 V, which is in excellent agreement with that estimated for sub-bandgap illumination, B. G. Barker, V. S. N. Chava, K. M. Daniels, M. V. S. Chandrashekhar, and A. B. Greytak, 2D Mater. 5, 011003 (2018), which is hereby incorporated by reference.

The UV-visible rejection ratio, $R_{(270\ nm)}/R_{(400\ nm)}$, is better in the SC-mode~5.6×10$^3$ compared to ~12.3 in the SE-mode. The current disclosure attributes the poor visible rejection in the SE mode to absorption of sub-bandgap light by donor acceptor pairs (DAP) present in the highly doped n$^+$-SiC substrate but not in the low-doped p-SiC, since the collection region in this mode spans the n$^+$-substrate unlike the SC-mode. The current disclosure excludes the contribution of stacking faults to the sub-bandgap response in the SE-mode shown in previous devices, as the SPCM maps show no evidence of this (FIG. 8). Our R($\lambda$) and visible rejection values are compared with those of other wide bandgap photodetectors, see FIG. 9, Table I, where the device of the current disclosure compares well. The current disclosure also notes that high responsivity is achieved at a relatively low bias voltage of 20 V compared to >100 V for the avalanche photodiodes.

The response times and dark noise spectrum were measured using a virtual-ground transimpedance current preamplifier to convert the dark and photo-induced currents to a voltage. This output voltage signal was visualized on an oscilloscope in the time domain for the response times and was converted into the frequency domain using the Fast Fourier Transform (FFT) function for the noise power measurements in the dark. The response times were measured at 320 nm (largest absolute photocurrent) by mechanically chopping the light and fitting the resultant output with exponential decay/growth, where the time constant is taken as the response time. In the SC-mode, ON/OFF response times of 10 ms/47 ms are extracted, whereas in the SE-mode, ON/OFF response times of 46 ms/730 ms are extracted. These values are significantly slower than $\tau_{rec}$=20 ns estimated above, likely due to RC delays, as also seen at low collector currents in Si bipolar phototransistors. This assertion is supported by the fact that the response time is slower in the SE-mode, where the collector is a much larger area, leading to a large collector capacitance compared to the SC-mode. Mesa-isolation of the base-collector SiC p-n junction in the SE-mode is expected to improve the response time. Faster response times should also be observable at higher light levels.

The measured noise power density $S_n$(f) (in A$^2$/Hz) in the SE mode at $V_{CE}$=20 V is shown in the inset of FIG. 10, see also FIG. 6, along with the noise floor at this preamplifier gain setting. The 1/f flicker noise is clearly observed and reaches the measurement limit at frequencies >1 kHz. The current disclosure did not observe a crossover to a shot-noise limited regime in the measurements. In the SC-mode, on the other hand, the dark current was only 230 pA. The noise power density was measured to be <10$^{-28}$ A$^2$/Hz, the noise threshold at the corresponding pre-amplifier setting, and a 1/f regime was unmeasurable with the setup. Thus, the current disclosure estimates the dark noise spectral density for the shot noise using $S_n(f)=2eI_c(\text{dark})$ for the SC-mode devices. At $V_{CE}=20$ V, a white noise density of $S_n(f)\approx 6\times 10^{-29}$ A$^2$/Hz is used for estimation of the noise equivalent power (NEP) below. From the measured current noise spectrum, $S_n(f)$ (FIG. 10 inset, FIG. 6), NEP, the minimum optical power that can be detected by at the given noise level, is extracted. For a bandwidth of B, the total noise current is given by $$\langle i_n^2 \rangle = \int_0^B S_n(f)df = \int_0^1 S_n(1)df + \int_1^B S_n(f)df, \quad (12)$$

where the current disclosure assumes that the value at 1 Hz is assumed to be flat until 0 Hz in the first integral on the RHS as is commonly done by those of skill in the art. The noise equivalent power (NEP) is then estimated using the following equation:

$$NEP = \frac{\sqrt{\langle i_n^2 \rangle}}{R}, \quad (13)$$

where R is the responsivity (in A/W) of the device. From the NEP, the specific detectivity (D*) is $$D^* = \frac{\sqrt{A \times B}}{NEP}, \quad (14)$$

where A is the device area in cm$^2$, and B is the bandwidth in Hz. Given that the response time is 47 ms in the SC-mode, the current disclosure assumes a bandwidth of 20 Hz, giving NEP=2.3 fW and D*=4.4×10$^{13}$ Jones. Similarly, since the response time in the SE-mode is 730 ms, we assume a 1 Hz bandwidth, giving NEP=3.3×10$^{-12}$ W and D*=9.5×10$^9$ Jones. These values compare favorably with other visible-blind detectors, see FIG. 9, Table I. Mesa-isolation of the base-collector SiC p-n junction would reduce the area to ~4.9×10$^{-4}$ A/cm$^2$, leading to a reduction of dark current to <270 pA from 670 nA assuming the same leakage current density, pushing the NEP to <2 fW. The response time should also improve as discussed above, with a corresponding increase in B and consequently D*.

In summary, the TFS grown EG/SiC Schottky contact bipolar phototransistors of the current disclosure showed a high UV responsivity, and this is attributed to both high optical transmission through graphene contact layers at the top and also bipolar gain observed in these devices. The device performance of the EG/SiC phototransistor is compared in SE and SC modes. UV-visible rejection >10$^3$ is achieved, with responsivity ~17-25 A/W at low voltages $V_{CE}=20$ V. Additionally, the voltage tunable responsivity observed in the present EG/SiC phototransistor devices in SE mode is useful for solar-blind UV detection applications. The response times of these devices are relatively slow, 10 ms-730 ms, compared to low responsivity photodiodes. Finally, NEP=2.3 fW and D*=4.4×10$^{13}$ Jones indicate excellent performance of these devices in both SE and SC modes and are comparable to or better than the state-of-the-art. The overall performance of the phototransistor of the current disclosure may be improved further by mesa-isolation of the SiC p-n junction base layer, making them an attractive candidate for visible-blind UV detection applications.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art using the teachings disclosed herein.

What is claimed is:

1. A voltage tunable solar-blind UV detector comprising:
    a vertical bipolar transistor structure;
    an upper epitaxial graphene emitter layer;
    an intermediate p-SiC epilayer;
    an n$^+$SiC substrate layer;
    the upper epitaxial graphene emitter layer, intermediate p-SiC epilayer and the n$^+$SiC substrate layer are vertically stacked to form an:
        epitaxial graphene/SiC heterojunction-based;
        voltage tunable;
        solar-blind;
        UV detector with a peak wavelength responsivity shift from 320 nm to less than 250 nm dependent upon a bias voltage applied at the epitaxial graphene emitter layer.

2. The voltage tunable solar-blind UV detector of claim 1, wherein dopant concentration of the epilayer is p-type and ranges between 3×10$^{14}$ cm$^{-3}$ to 4×10$^{14}$ cm$^{-3}$.

3. The voltage tunable solar-blind UV detector of claim 1 with photoresponsivity of substantially 17-25 A/W at bias voltage=20 V.

4. The voltage tunable solar-blind UV detector of claim 1, wherein the upper epitaxial graphene emitter layer is transparent.

5. The voltage tunable solar-blind UV detector of claim 1 further comprising detection and discrimination of ultraviolet radiation ranging from 200-400 nm at low bias voltage.

6. The voltage tunable solar-blind UV detector of claim 1 further comprising a UV-visible rejection of >10$^3$.

7. The voltage tunable solar-blind UV detector of claim 1 further wherein p-SiC epilayer thickness ranges from 0.1 μm-100 μm.

8. The voltage tunable solar-blind UV detector of claim 1, wherein the thickness of the upper epitaxial graphene emitter layer ranges from 1 monolayer to 20 monolayers.

9. The voltage tunable solar-blind UV detector of claim 1, wherein the voltage tunable solar-blind UV detector detects UV-C radiation, λ200-280 nm, without responding to UV radiation wherein λ>290 nm.

10. A method of forming a voltage tunable solar-blind UV detector comprising:
    forming a vertical bipolar transistor structure;
    growing a p-SiC epilayer on an n$^+$SiC substrate layer substrate via a CVD reactor;
    growing an epitaxial graphene top electrode layer on the p-SiC epilayer by selective etching of
    Si from SiC using a Tetrafluorosilane gas precursor;
    vertically stacking the epitaxial graphene top electrode layer, intermediate p-SiC epilayer and the n$^+$SiC substrate layer to form an:
        epitaxial graphene/SiC heterojunction-based;
        voltage tunable;

solar-blind UV detector; and applying a bias voltage to the epitaxial graphene top electrode layer to shift a peak wavelength responsivity from 320 nm to less than 250 nm dependent upon the bias voltage applied.

11. The method of 10, wherein the CVD reactor uses dichlorosilane and propane in hydrogen ambient at 300 Ton and 1600 C.

12. The method of claim 11, wherein the C/Si ratio may range from 1.5 to 1.9.

13. The method of claim 10, wherein dopant concentration of the p-SiC epilayer is p-type and ranges between $3 \times 10^{14}$ cm$^{-3}$ to $4 \times 10^{14}$ cm$^{-3}$.

14. The method of claim 10, wherein the epitaxial graphene top electrode layer is grown on the p-SiC epilayer at 1600° C. and 300 Ton.

15. The method of claim 14, wherein a $SiF_4$ precursor in Argon is used to grow the epitaxial graphene E-G top electrode layer on the p-SiC epilayer.

16. The method of 10, wherein substantially circular graphene regions are defined using photolithography followed by $O_2$ plasma reactive-ion etching.

17. The method of 16, wherein the substantially circular graphene mesa regions have a diameter of substantially 250 gm.

18. The method of 10, wherein the thickness of the epitaxial graphene top electrode layer is ranges from 1 monolayer to 20 monolayers.

19. The method of 10, wherein the voltage tunable solar-blind UV detector detects UV-C radiation, λ200-280 nm, without responding to UV radiation wherein λ>290 nm.

* * * * *